United States Patent
Chigullapalli et al.

(10) Patent No.: US 12,156,374 B2
(45) Date of Patent: Nov. 26, 2024

(54) MANIFOLD FOR LIQUID COOLED COMPUTING SYSTEMS

(71) Applicant: ZT Group Int'l, Inc., Secaucus, NJ (US)

(72) Inventors: Sruti Chigullapalli, Seattle, WA (US); Chen An, Bergenfield, NJ (US); Yu Wang, Bayonne, NJ (US)

(73) Assignee: ZT GROUP INT'L, INC., Secaucus, NJ (US)

(*) Notice: Subject to any disclaimer, the term of this patent is extended or adjusted under 35 U.S.C. 154(b) by 245 days.

(21) Appl. No.: 17/936,444

(22) Filed: Sep. 29, 2022

(65) Prior Publication Data
US 2024/0114649 A1  Apr. 4, 2024

(51) Int. Cl.
*H05K 7/20* (2006.01)
*G06F 1/20* (2006.01)

(52) U.S. Cl.
CPC .......... *H05K 7/20272* (2013.01); *G06F 1/20* (2013.01); *H05K 7/20254* (2013.01); *H05K 7/20763* (2013.01)

(58) Field of Classification Search
CPC combination set(s) only.
See application file for complete search history.

(56) References Cited

U.S. PATENT DOCUMENTS

| | | | |
|---|---|---|---|
| 7,450,385 B1 * | 11/2008 | Campbell | H05K 7/20781 361/689 |
| 8,797,740 B2 * | 8/2014 | Campbell | H05K 7/20836 361/699 |
| 9,009,968 B2 * | 4/2015 | Campbell | H05K 7/20272 361/699 |
| 9,066,460 B2 * | 6/2015 | Brunschwiler | H05K 13/00 |
| 9,332,673 B2 * | 5/2016 | Boday | F28D 15/02 |
| 9,890,878 B2 * | 2/2018 | Ellsworth, Jr. | F16L 11/04 |
| 9,913,403 B2 * | 3/2018 | Krug, Jr. | H05K 7/20781 |
| 2008/0310104 A1 * | 12/2008 | Campbell | H05K 7/20781 29/729 |
| 2018/0100608 A1 * | 4/2018 | Ellsworth, Jr. | F16L 33/30 |
| 2024/0114649 A1 * | 4/2024 | Chigullapalli | G06F 1/20 |

* cited by examiner

*Primary Examiner* — Lisa Lea-Edmonds
(74) *Attorney, Agent, or Firm* — POLSINELLI PC

(57) ABSTRACT

A manifold system includes a supply manifold and a return manifold. The supply manifold delivers fluid to cold plates to cool processing units of a computing system. The return manifold receives the fluid from the cold plates. The supply manifold has supply fluid ports equidistantly spaced about the side surface of the supply manifold, and the return manifold has return fluid ports equidistantly spaced about the side surface of the return manifold.

20 Claims, 9 Drawing Sheets

MANIFOLD FOR LIQUID COOLED COMPUTING SYSTEMS

FIELD

The present disclosure relates generally to a manifold operable to be installed in a liquid cooled computing system.

BACKGROUND

Computing systems such as liquid cooled modular servers and/or information handling systems, often need a set of fluid manifolds to supply and return fluid to the processing unit(s) in the computing system. The processing units may run at different temperatures which can result in performance differences and reliability concerns. The fluid delivered through the manifold(s) are operable to cool down the processing units.

BRIEF DESCRIPTION OF THE DRAWINGS

Implementations of the present technology will now be described, by way of example only, with reference to the attached figures, wherein.

DETAILED DESCRIPTION

Figure 1A:
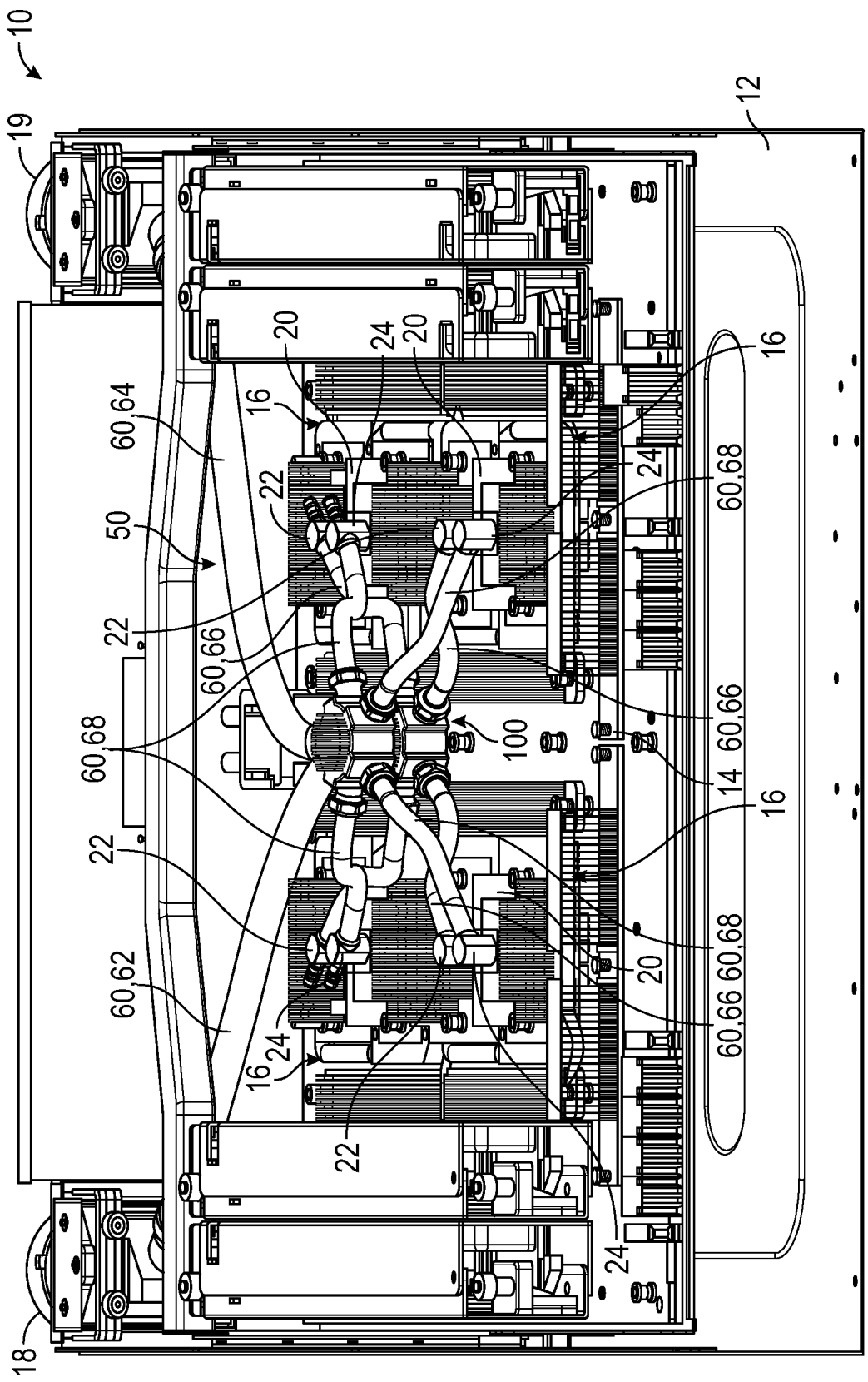
FIG. 1A is a perspective view of a computing system with a cooling system including a manifold system according to the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented. The term "coupled" is defined as connected, whether directly or indirectly through intervening components, and is not necessarily limited to physical connections. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "about" means reasonably close to the particular value. For example, about does not require the exact measurement specified and can be reasonably close. As used herein, the word "about" can include the exact number. The term "near" as used herein is within a short distance from the particular mentioned object. The term "near" can include abutting as well as relatively small distance beyond abutting. The terms "comprising," "including" and "having" are used interchangeably in this disclosure. The terms "comprising," "including" and "having" mean to include, but not necessarily be limited to the things so described.

Disclosed herein is a cooling system that includes a manifold system and a plurality of conduits. The cooling system is operable to deliver and withdraw heat transfer fluid to and from cold plates corresponding to processing units. The heat transfer fluid is operable to flow through the cold plates to cool the processing units. The manifold system includes a supply manifold and a return manifold. The supply manifold and the return manifold include fluid ports equidistantly spaced about the sides of the supply manifold and the return manifold. By having the fluid ports equidistantly spaced, the manifold system can be positioned in the computing system such that the distance to each of the cold plates is equal. With the distance between each processing unit and cold plate from the manifold system, the conduits operable to transfer the heat transfer fluid between the manifold system and the cold plates are equal in length (e.g., the conduits corresponding to the return manifold all are equal in length and the conduits corresponding to the supply manifold all are equal in length). With the conduits having the same lengths, the flow distribution of heat transfer fluid to each of the cold plates is equal.

In at least one example, the return manifold can include one or more heat sinks to reduce liquid temperature through indirect air cooling, thereby reducing heat load into the sidecar.

In at least one example, the conduits and manifold system can be quickly disconnected to allow for easy serviceability of individual cold plates, the supply manifold, and/or the return manifold. The conduits and the manifold system can include valves that are operable to automatically close upon disconnecting the conduit(s) from the manifold system. Accordingly, fluid does not leak when disconnecting the conduit(s) from the manifold system, allowing for easy serviceability without concern of damaging the computing system by the fluid.

In at least one example, the manifold system can be disposed in a leak container operable to prevent any fluid from reaching the processing units and/or any other fluid-sensitive components of the computing system. Accordingly, any incidental leakage from the manifold system does not damage the computing system.

Figure 1B:
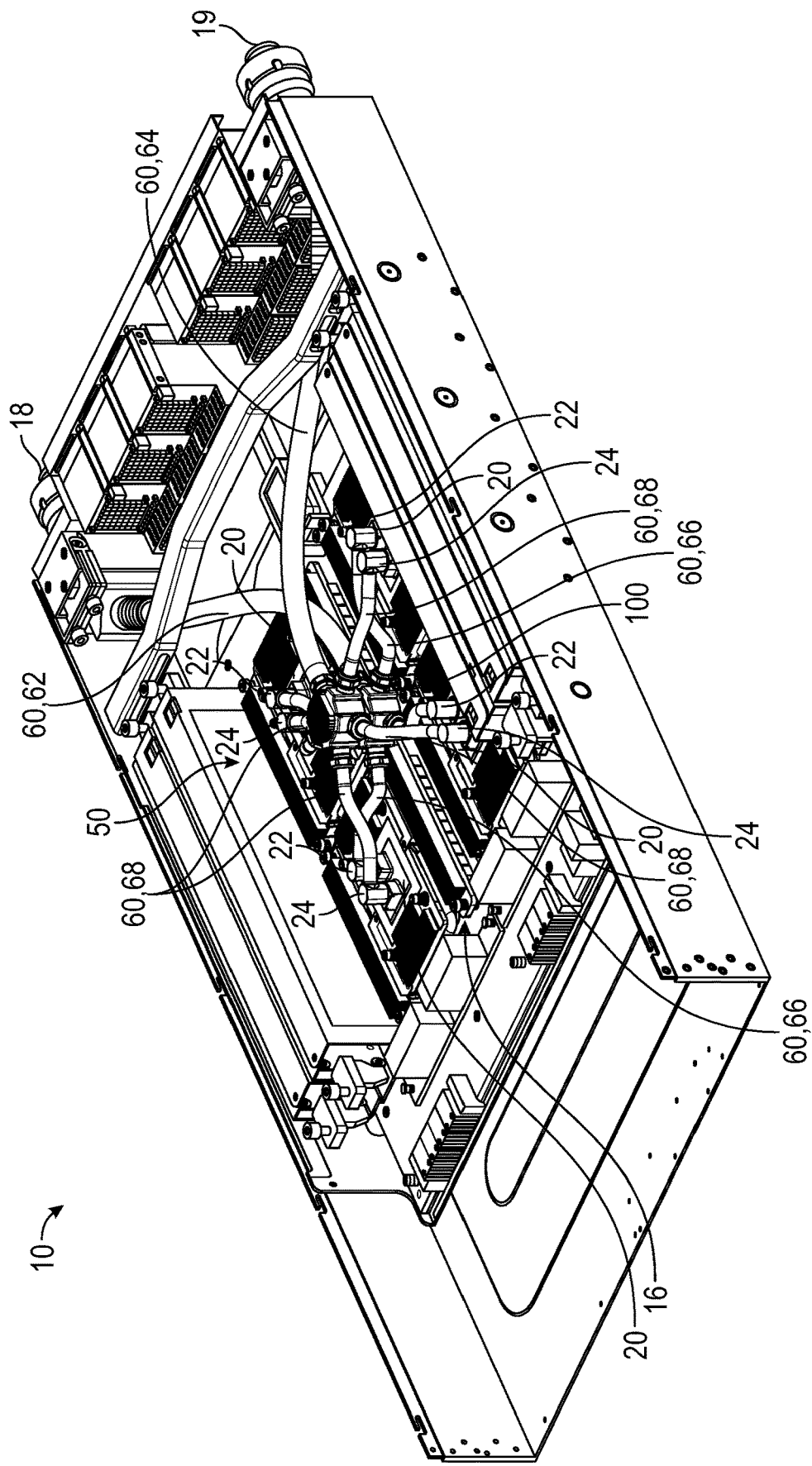
FIG. 1B is another perspective view of the computing system of FIG. 1A.

The disclosure now turns to FIGS. 1A and 1B, which illustrate an example of a computing system 10 to be used, for example, in a liquid cooled modular server and/or information handling system. The computing system 10 can include a body 12 operable to contain a plurality of components such as any combination of one or more motherboards 14, one or more hard drives, one or more risers, and/or a plurality of processing units 16. Additional components can be disposed within the body 12 without deviating from the scope of the disclosure. As illustrated in FIGS. 1A and 1B, the computing system 10 can include a plurality of processing units 16 disposed within the body 12. The processing units 16 can be arranged in an array. The processing units 16 can be coupled with the motherboard 14. As illustrated in FIGS. 1A and 1B, the computing system 10 can include four processing units 16. In some examples, the computing system 10 can include six, eight, or more processing units 16.

In at least one example, the computing system 10 can include a plurality of cold plates 20 operable to cool the corresponding processing units 16. The cold plates 20 can be disposed on top of the processing units 16. The cold plates 20 can be in direct contact with the processing units 16. The cold plates 20 can be operable to absorb heat from the processing units 16 and dissipate the heat to heat transfer fluid in a cooling system 50.

Thermal management of computing systems 10 can be critical to the performance and time between failures for the computing system 10. As computing systems 10 such as modular servers and/or information handling systems can have higher temperature environments, air cooling can be insufficient to adequately cool down the computing systems 10. Accordingly, the cooling system 50 utilizes heat transfer fluid to pass through the computing system 10 and lower the temperature of the components of the computing system 10 to within a desired threshold.

The cooling system 50 includes a manifold system 100 operable to distribute the heat transfer fluid to and from the processing units 16 (e.g., via the cold plates) to lower the temperatures of the processing units 16. The heat transfer fluid can enter the computing system 10 via an entry port 18. The heat transfer fluid can flow through the cooling system 50 to manage the temperatures (e.g., cool) of the processing units 16 via a plurality of conduits 60.

The plurality of conduits 60 of the cooling system 50 can include any combination of supply intake conduit 62, a plurality of supply processing conduits 66, a plurality of return processing conduits 68, and/or a drain conduit 64. The heat transfer fluid can flow from the entry port 18 to the manifold system 100 via the supply intake conduit 62. The plurality of supply processing conduits 66 are operable to be fluidly coupled with the manifold system 100 and fluidly coupled with a corresponding cold plate intake port 22 of the cold plate 20. The cold take intake port 22 receives and transfers the heat transfer fluid through the cold plate 20. As the heat transfer fluid passes through the cold plate 20, heat from the processing unit 16 is transferred to the heat transfer fluid, cooling the processing unit 16. The heated heat transfer fluid then flows out of the cold plate 20 via the cold plate return port 24. The return processing conduits 68 are operable to be fluidly coupled with the cold plate return port 24 and the manifold system 100. The heated heat transfer fluid passes from the cold plate return port 24 of the cold plate 20 through the return processing conduit 68 to the manifold system 100. From the manifold system 100, the heated heat transfer fluid is drained out of the computing system 10 via an exit port 19 through the drain conduit 64.

As can be seen in FIGS. 1A and 1B, the plurality of supply processing conduits 66 have a same length. Similarly, the plurality of return processing conduits 68 have a same length. By having the same lengths for the supply processing conduits 66 and the same lengths for the return processing conduits 68, the flow distribution to each of the processing units 16 is equal. Accordingly, each of the processing units 16 can be sufficiently and equally cooled to manage the temperatures of the processing units 16.

Figure 2A:
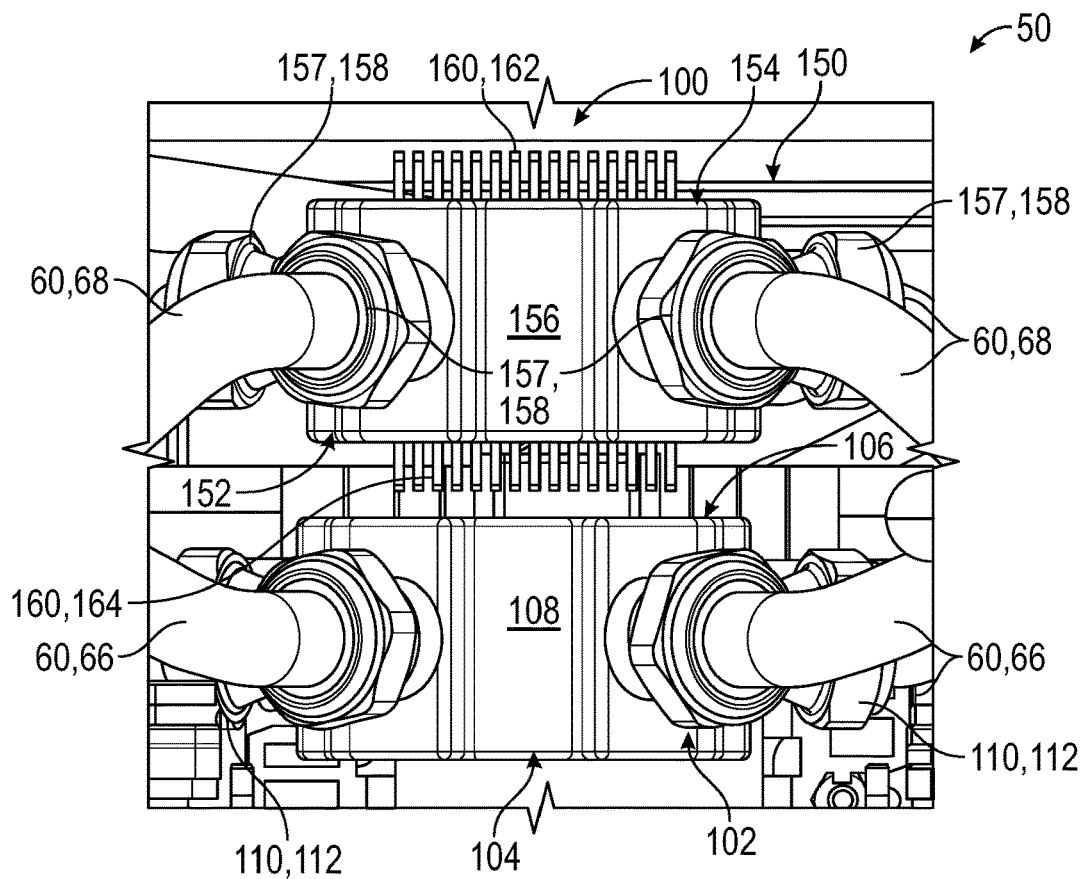
FIG. 2A is a side elevation view of the manifold system.
Figure 2B:
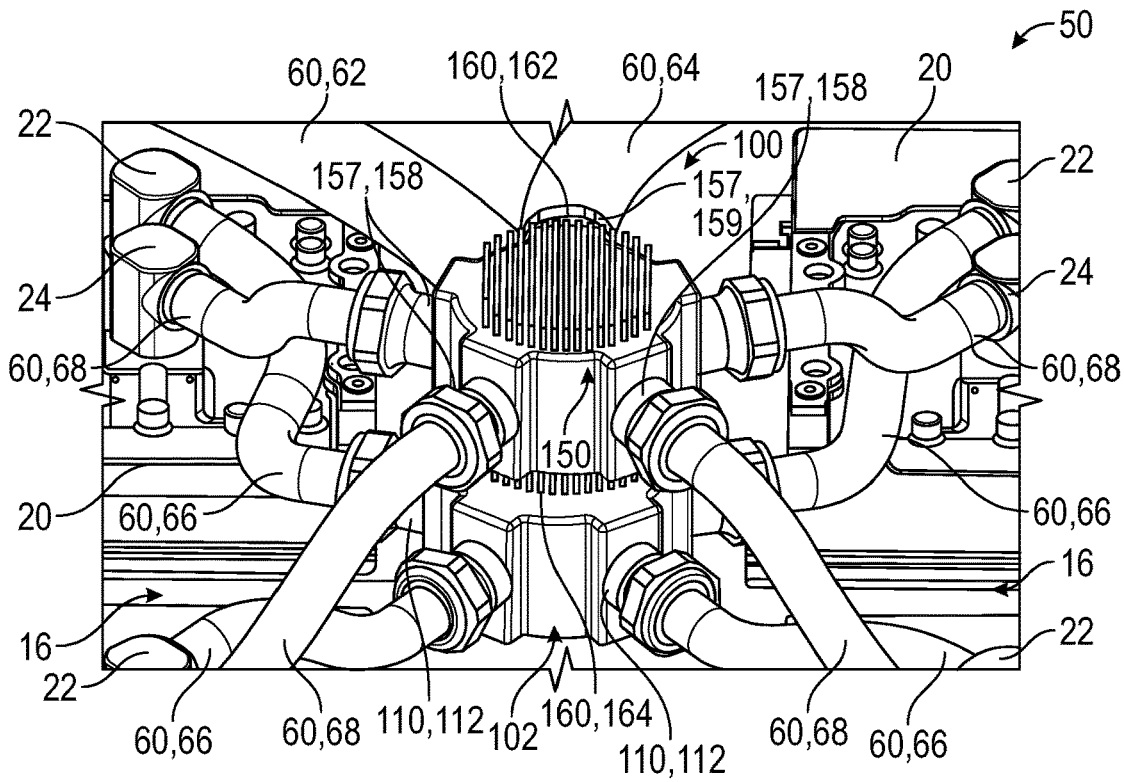
FIG. 2B is a perspective view of the manifold system of FIG. 2A.

FIGS. 2A and 2B illustrate an enlarged view of the manifold system 100. The manifold system 100 includes a supply manifold 102 and a return manifold 150. The supply manifold 102 is fluidly coupled with the entry port 18 via the supply intake conduit 62. The supply manifold 102 is operable to receive the heat transfer fluid and distribute the heat transfer fluid out to each of the processing units 16 (e.g., to the cold plates 20 corresponding with each of the processing units 16). The supply manifold 102 delivers the heat transfer fluid to the cold plates 20 to cool the processing units 16. To distribute the heat transfer fluid out to the processing units 16 and/or cold plates 20, the supply manifold 102 has a plurality of supply fluid ports 110. The supply fluid ports 110 are operable to be fluidly coupled with the supply processing conduits 66 and/or the supply intake conduit 62. The supply fluid ports 110 can include an intake port 111 and a plurality of supply processing ports 112. The intake port 111 is operable to be fluidly coupled with the supply intake conduit 62 which is operable to delivery the heat transfer fluid to the supply manifold 102. The heat transfer fluid is then received in one or more chambers within the supply manifold 102. The supply processing ports 112 are operable to be fluidly coupled with the corresponding supply processing conduits 66 which are operable to deliver the heat transfer fluid from the supply manifold 102 to the corresponding cold plates 20. Accordingly, the heat transfer fluid passes through the supply intake conduit 62 into the supply manifold 102 via the intake port 111 and is distributed out of the supply manifold 102 via the supply processing ports 112 through the supply processing conduits 62 to the cold plates 20 of the processing units 16.

The supply fluid ports 110 (e.g., the intake port 111 and the supply processing ports 112) are equally distributed about the perimeter of the supply manifold 102. As such, an angle between each supply fluid port 110 about the perimeter of the supply manifold 102 can be substantially equal. For example, as illustrated in FIGS. 1A-2B, the supply manifold 102 includes one intake port 111 and four supply processing ports 112. The angle between each of the five supply fluid ports 110 is about 72 degrees (e.g., 360 degrees/5). In some examples, the intake port 111 may not be considered in this calculation, and only the supply processing ports 112 are equally distributed about the perimeter of the supply manifold 102. In such an example, the angle between the four supply processing ports 112 can be about 90 degrees (e.g., 360 degrees/4). By having equal distribution of the supply fluid ports 110, the heat transfer fluid can be equally delivered out of the supply manifold 102, and the supply processing conduits 66 can be all be equal in length. With such a design, the supply manifold 102 can be positioned in the center of the processing units 16, so the distance from each processing unit 16 is equal. Accordingly, the equal lengths of the supply processing conduits 66 allows for equal distribution of flow of the heat transfer fluid.

After the heat transfer fluid passes through the cold plates 20, the heat transfer fluid is returned to the manifold system 100. The heat transfer fluid flows out of the cold plate return port 24 through the return processing conduits 68 into the return manifold 150 before leaving the computing system 10 via the drain conduit 64. The return manifold 150 is fluidly coupled with the exit port 19 via the drain conduit 64. The return manifold 150 is operable to receive the heated heat transfer fluid from each of the processing units 16 (e.g., to the cold plates 20 corresponding with each of the processing units 16). The return manifold 150 receives the heated heat transfer fluid from the cold plates 20 to help manage the temperature of the processing units 16. By removing the heated heat transfer fluid, new heat transfer fluid at a lower temperature can be inserted into the cold plates 20 such that the temperature of the processing units 16 can continually be cooled. To receive the heat transfer fluid from the processing units 16 and/or cold plates 20, the return manifold 150 has a plurality of return fluid ports 157. The return fluid ports 157 are operable to be fluidly coupled with the return processing conduits 68 and/or the drain conduit 64. The return fluid ports 157 can include a drain port 159 and a plurality of return processing ports 158. The return processing ports 158 are operable to be fluidly coupled with the corresponding return processing conduits 68 which are operable to remove the heated heat transfer fluid from the cold plates 20 to the return manifold 150. The heated heat transfer fluid is received in one or more chambers within the return manifold 150. The drain port 159 is operable to be fluidly coupled with the drain conduit 64 which is operable to deliver the heat transfer fluid from the return manifold 150 out of the computing system 10 via the exit port 19. Accordingly, the heated heat transfer fluid passes from the cold plates 20 of the processing units 16 through the return processing conduits 68 to the return manifold 150 and through the drain conduit 64 out of the computing system 10 via the exit port 19.

In at least one example, similar to the supply manifold 102, the return fluid ports 157 (e.g., the drain port 159 and the return processing ports 158) are equally distributed about the perimeter of the return manifold 150. As such, an angle between each return fluid port 157 about the perimeter of the return manifold 150 can be substantially equal. For example, as illustrated in FIGS. 1A-2B, the return manifold 150 includes one drain port 159 and four return processing ports 158. The angle between each of the five return fluid ports 158 is about 72 degrees (e.g., 360 degrees/5). In some examples, the drain port 159 may not be considered in this calculation, and only the return processing ports 158 are equally distributed about the perimeter of the return manifold 150. In such an example, the angle between the four return processing ports 158 can be about 90 degrees (e.g., 360 degrees/4). By having equal distribution of the return fluid ports 157, the heat transfer fluid can be equally returned to the return manifold 150, and the return processing conduits 68 can be all be equal in length. With such a design, the return manifold 150 can be positioned in the center of the processing units 16, so the distance from each processing unit 16 is equal. Accordingly, the equal lengths of the return processing conduits 68 allows for equal distribution of flow of the heat transfer fluid from the cold plates 20.

As illustrated in FIGS. 2A and 2B, the supply manifold 102 includes a top surface 106, a bottom surface 104 opposite the top surface 106, and a side surface 108 connecting the top surface 106 and the bottom surface 104. In at least one example, the supply fluid ports 110 can be formed in the side surface 108. The supply fluid ports 110 can be equidistantly spaced about the side surface 108 of the supply manifold 102. In at least one example, only the supply processing ports 112 are formed in the side surface 108 and the intake port 111 can be formed in the top surface 106 and/or the bottom surface 104.

The return manifold 150 includes a top surface 154, a bottom surface 152 opposite the top surface 154, and a side surface 156 connecting the top surface 154 and the bottom surface 152. In at least one example, the return fluid ports 157 can be formed in the side surface 156. The return fluid ports 157 can be equidistantly spaced about the side surface 156 of the return manifold 150. In at least one example, only the return processing ports 158 are formed in the side surface 156 and the drain port 159 can be formed in the top surface 154 and/or the bottom surface 152.

In at least one example, as shown in FIGS. 2A and 2B, the return manifold 150 can include one or more heat sinks 160. The heat sinks 160 can be operable to reduce a temperature of the heat transfer fluid within the return manifold 150 through indirect air cooling. By cooling the heated heat transfer fluid within the return manifold 150, the heat load into the sidecar can be reduced.

As illustrated in FIGS. 2A and 2B, the return manifold 150 can include a top heat sink 162 extending from and/or coupled to the top surface 154 of the return manifold 150. The top heat sink 162 is operable to reduce a temperature of the heated heat transfer fluid (e.g., through indirect air cooling). In at least one example, the return manifold 150 can be positioned on top of the supply manifold 102 (e.g., the bottom surface 152 of the return manifold 150 can be proximate to the top surface 106 of the supply manifold 102) to accommodate for the top heat sink 162. Within the computing system 10, there is greater air flow above the manifold system 100. Accordingly, by positioning the return manifold 150 on top of the supply manifold 102, greater volumes and/or rates of air can flow across the top heat sink 162. Additionally, in at least one example, fans for the computing system 10 may be positioned at a similar height as the top heat sink 162, allowing for greater air flow and greater cooling of the heated heat transfer fluid within the return manifold 150.

In at least one example, the return manifold 150 can include a bottom heat sink 164 extending from and/or coupled to the bottom surface 152 of the return manifold 150. The bottom heat sink 164 can be operable to reduce the temperature of the heated heat transfer fluid (e.g., through indirect air cooling). The manifold system 100 may be configured to provide for a distance between the return manifold 150 and the supply manifold 102 to allow for sufficient air flow across the bottom heat sink 164. Also, the distance between the return manifold 150 and the supply manifold 102 can prevent the higher temperature of the return manifold 150 from the heated heat transfer fluid from heating up the supply manifold 102 and the cooler heat transfer fluid therein.

Figure 3A:
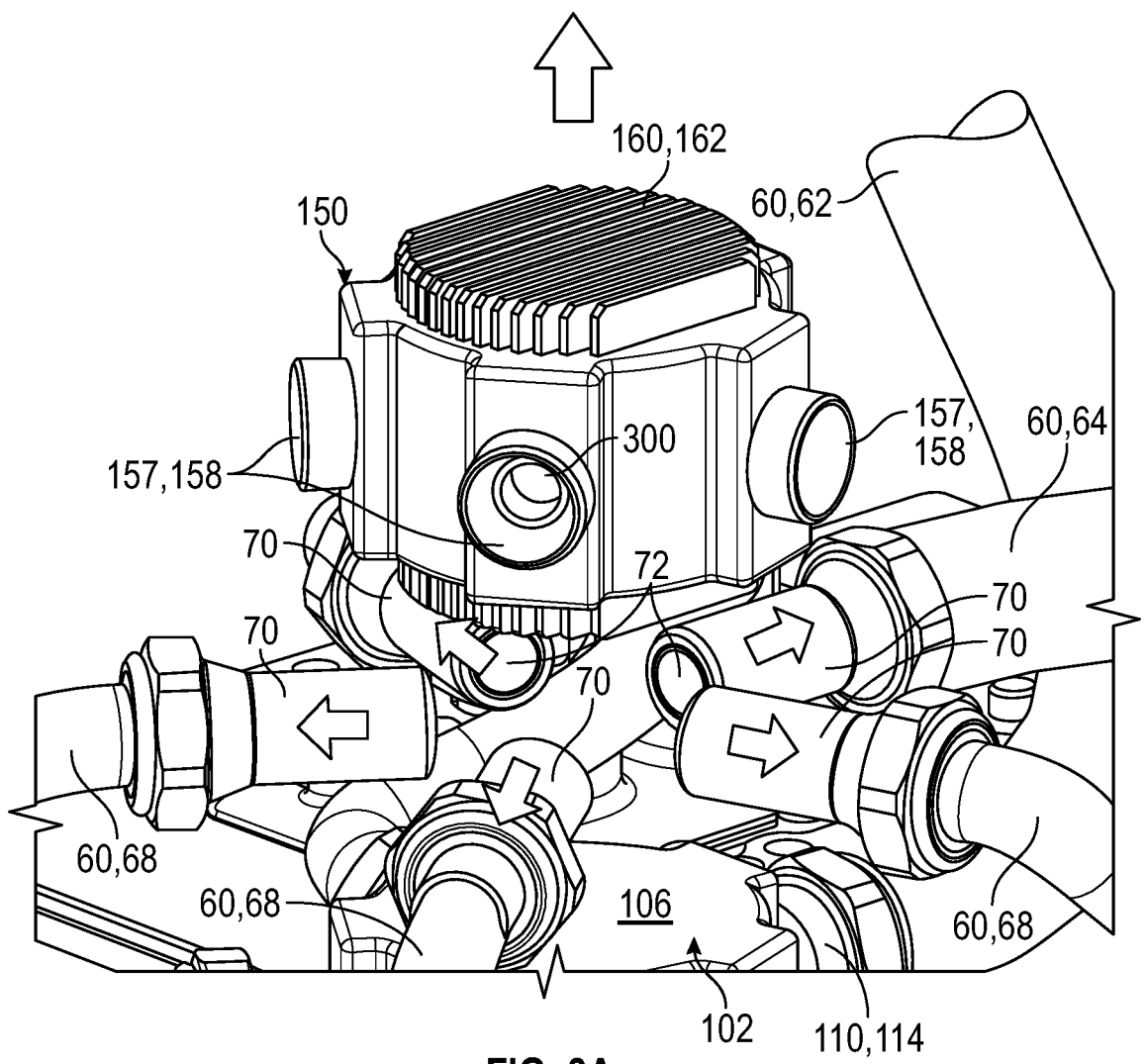
FIG. 3A is a perspective, partially disassembled view of a return manifold of the manifold system.
Figure 3B:
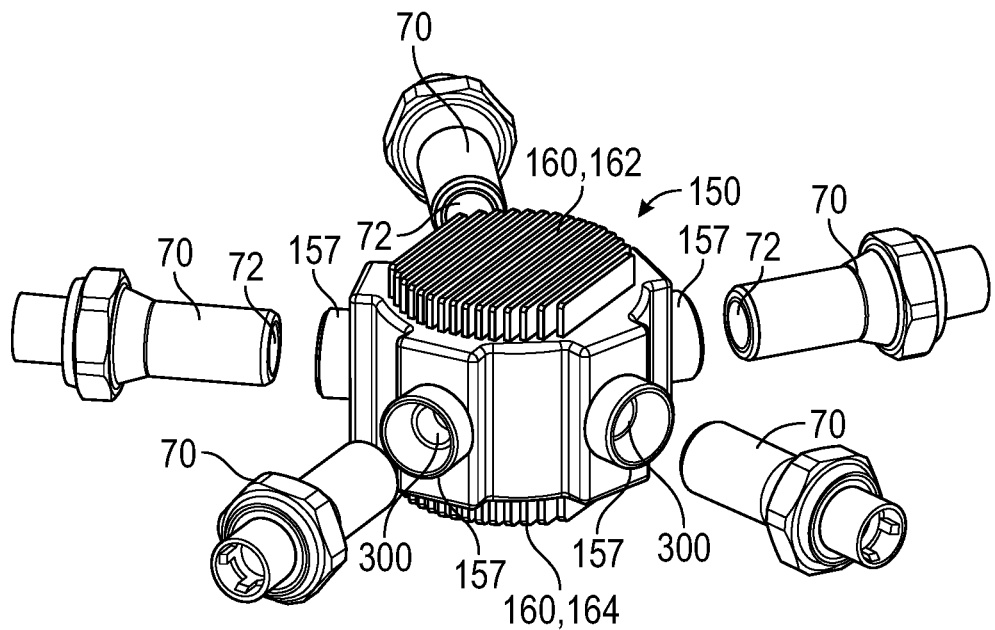
FIG. 3B is a perspective, partially disassembled view of the return manifold of FIG. 3A.
Figure 3C:
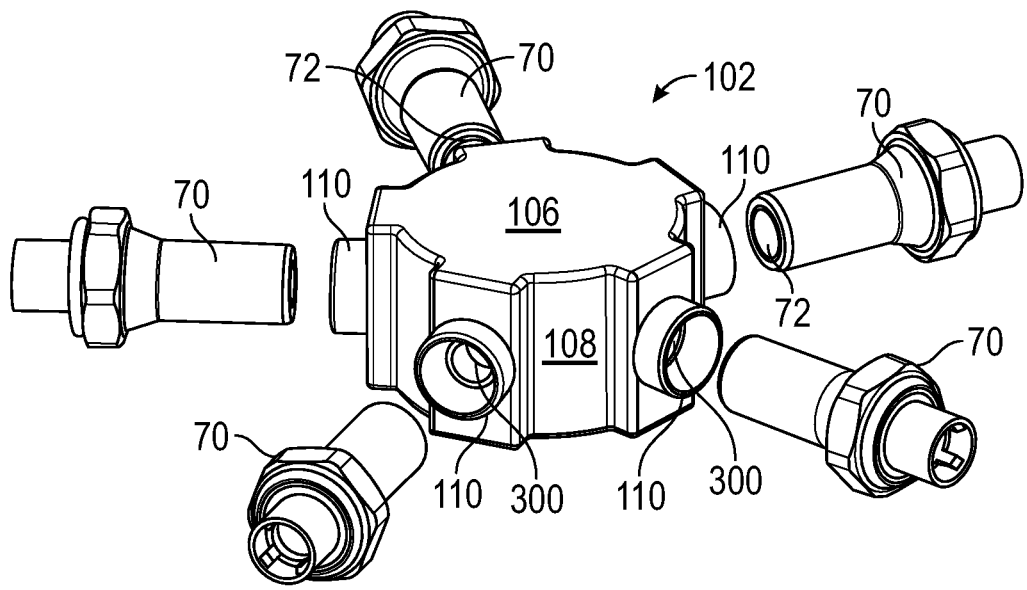
FIG. 3C is a perspective, partially disassembled view of a supply manifold of the manifold system.

FIGS. 3A-3C illustrate disconnection and/or connection of the conduits 60 from the manifold system 100. In at least one example, as illustrated in FIGS. 3A-3C, the conduits 60 and the manifold system 100 can be quickly disconnected and connected to allow for easy serviceability of individual cold plates 20, the return manifold 150, and/or the supply manifold 102. FIG. 3B illustrates the return manifold 150 with plugs 70, and FIG. 3C illustrates the supply manifold 102 with plugs 70. The plugs 70 are operable to be coupled with the conduits 60 and inserted into the return fluid ports 157 and/or the supply fluid ports 110 to permit fluidic communication between the manifold system 100 and the conduits 60.

In at least one example, as illustrated in FIGS. 3A-3C, the return fluid ports 157 and/or the supply fluid ports 110 can include port valves 300 operable to close and prevent fluid to flow across the return fluid ports 157 and/or the supply fluid ports 110. In at least one example, the plugs 70 can include plug valves 72 operable to close and prevent fluid to flow across the plugs 70.

In at least one example, the supply fluid ports 110 are operable to automatically close upon disconnection of the supply intake conduit 62 and/or the supply processing conduits 66. For example, when the plugs 70 corresponding to any of the supply intake conduit 62 and/or the supply processing conduits 66 are disconnected from the supply fluid ports 110, the corresponding port valve(s) 300 and the corresponding plug valve(s) 72 automatically close to prevent fluid from leaking in the computing system 10. Accordingly, the conduits 60 can be disconnected such that any or all of the cold plates 20 and/or the supply manifold 102 can be serviced without leaking fluid which can damage the computing system 10.

In at least one example, the return fluid ports 157 are operable to automatically close upon disconnection of the drain conduit 64 and/or the return processing conduits 68. For example, when the plugs 70 corresponding to any of the drain conduit 64 and/or the return processing conduits 68 are disconnected from the return fluid ports 157, the corresponding port valve(s) 300 and the corresponding plug valve(s) 72 automatically close to prevent fluid from leaking in the computing system 10. Accordingly, the conduits 60 can be disconnected such that any or all of the cold plates 20 and/or the return manifold 150 can be serviced without leaking fluid which can damage the computing system 10.

Figure 4A:
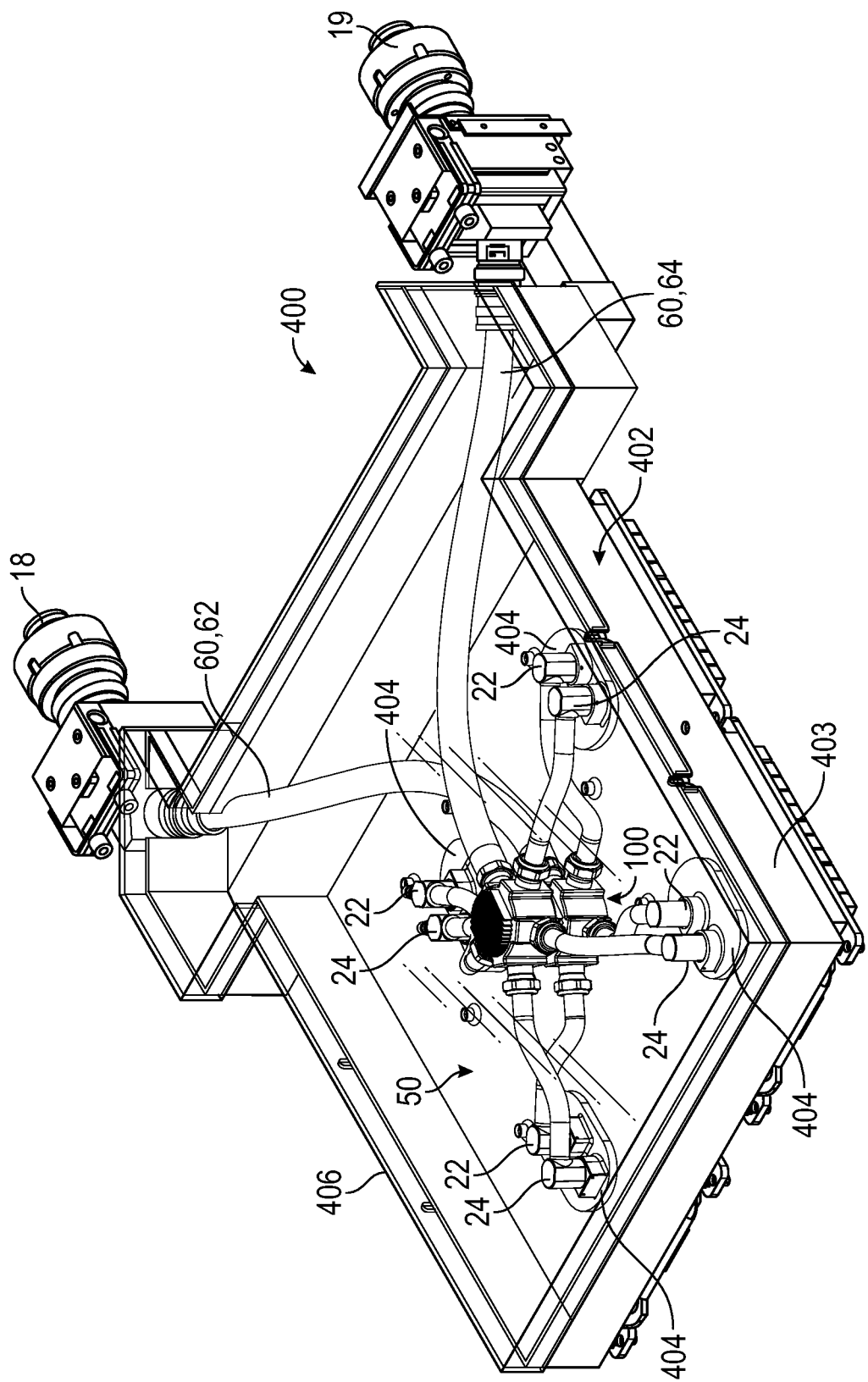
FIG. 4A is a partial perspective view of the computing system with a leak container.

FIGS. 4A-5C illustrate a leak container 400. As illustrated in FIGS. 4A and 4B, the manifold system 100 and/or the cooling system 50 is operable to be disposed in the leak container 400. The leak container 400 is operable to prevent fluid that leaks from the manifold system 100 and/or the conduits 60 from reaching the plurality of processing units 16 and/or any other fluid-sensitive components in the computing system 10. The leak container 400 can include a body 402 operable to receive the manifold system 100 and/or cooling system 50. The body 402 can include side walls 403 operable to prevent fluid from flowing out from the body 402 of the leak container 400. In at least one example, the leak container 400 can include a lid 406 which can isolate the cooling system 50 from the rest of the computing system 10. In at least one example, the leak container 400 can be a support structure for the manifold system 100.

Figure 4B:
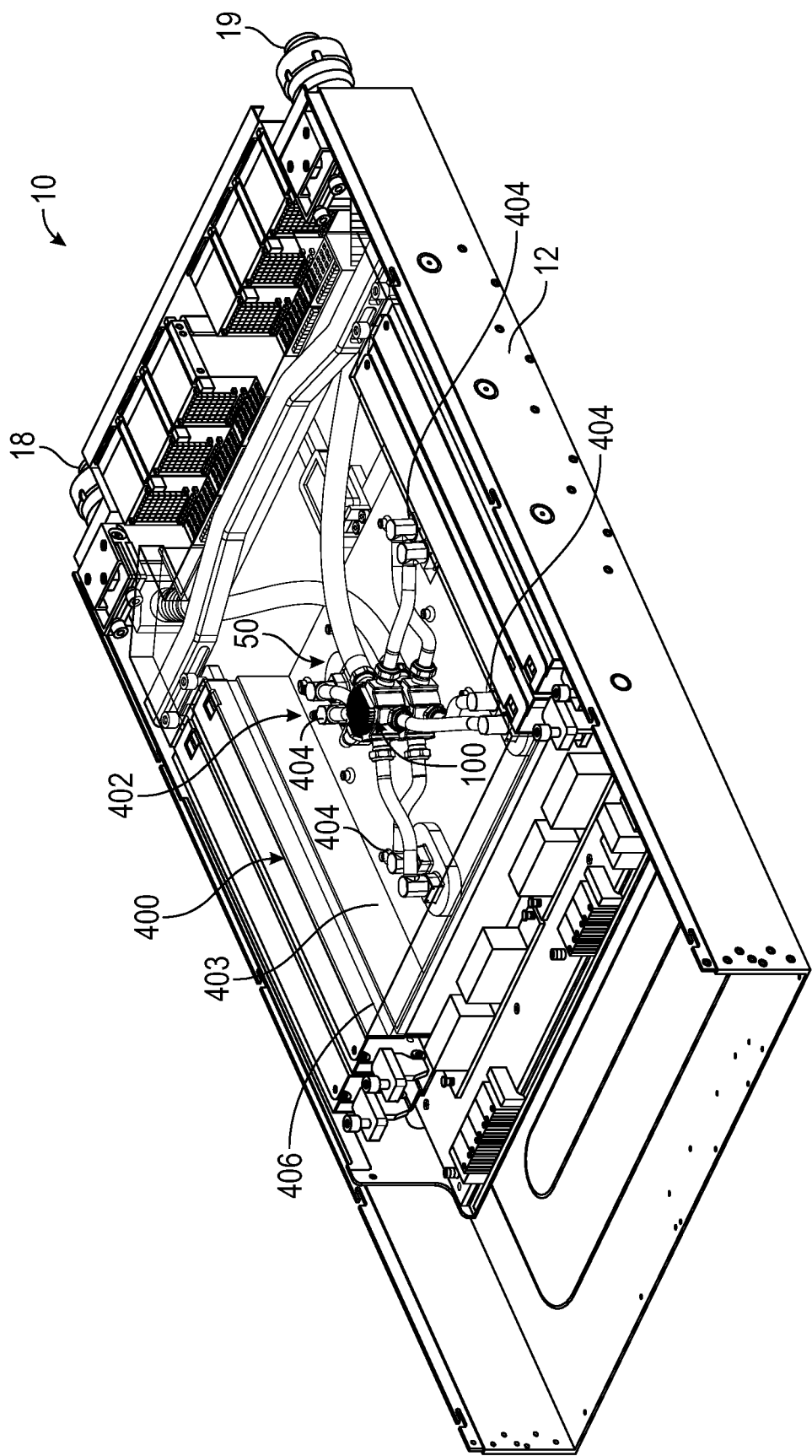
FIG. 4B is a perspective view of the computing system with the leak container.

In at least one example, as shown in FIGS. 4A and 4B, the cold plate intake port 22 and the cold plate return port 24 can extend through a gasket 404 which forms a seal across the body 402 of the leak container 400. Accordingly, the conduits 60 can be fluidly coupled with the cold plates 20 while preventing any leakage from the cooling system 50 from reaching the processing units 16 and/or other components of the computing system 10.

Figure 5A:
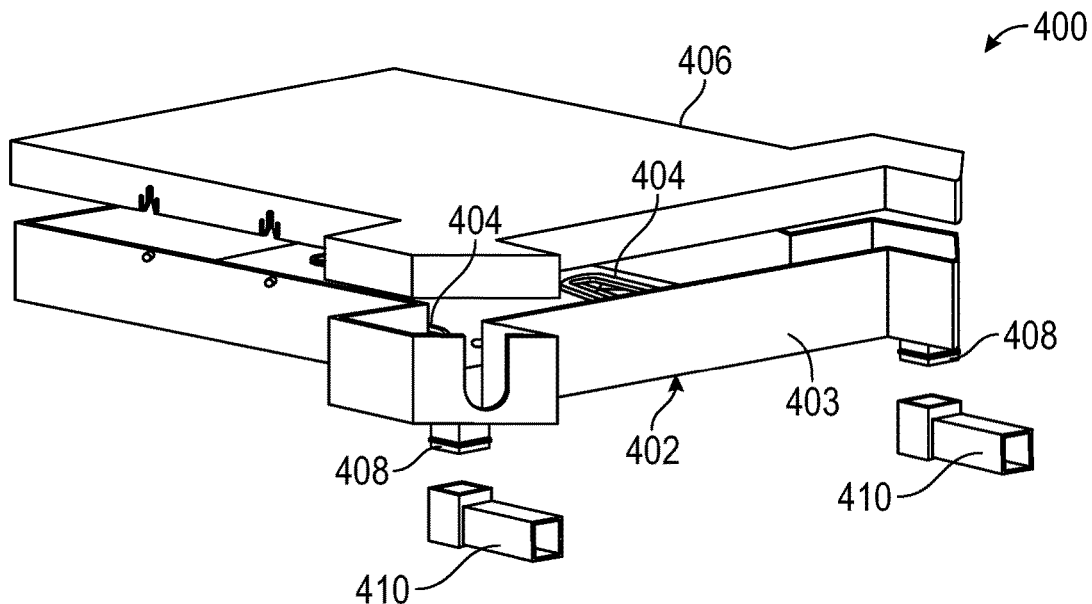
FIG. 5A is a perspective, exploded view of the leak container.
Figure 5B:
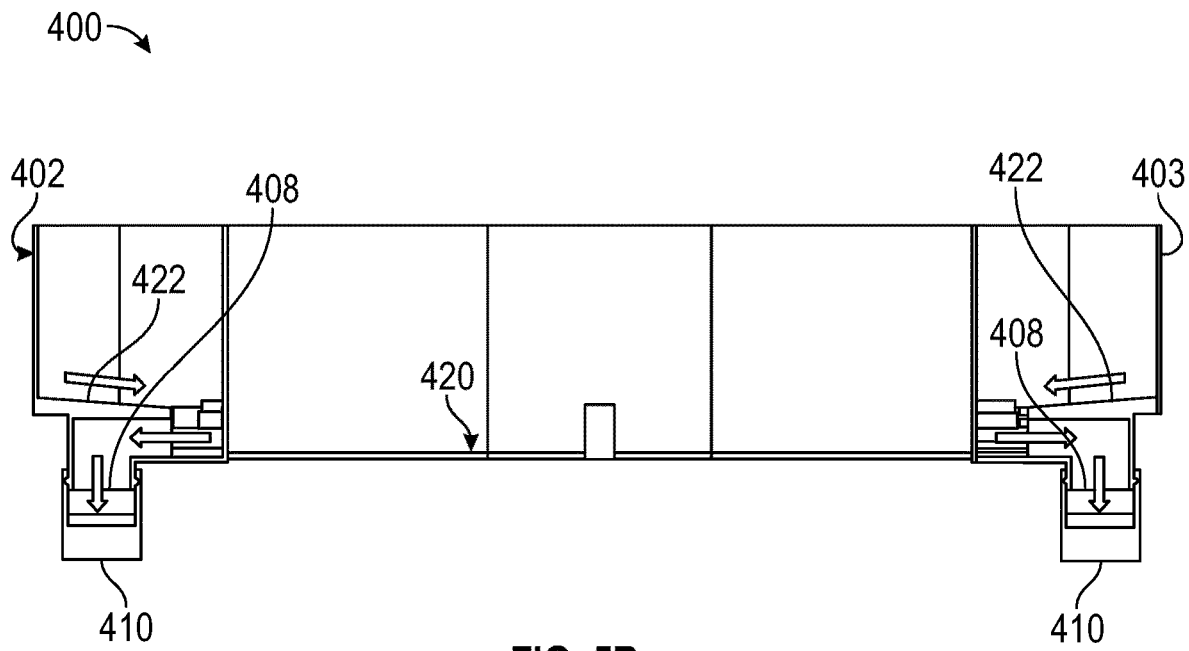
FIG. 5B is a front, cross-sectional view of the leak container.
Figure 5C:
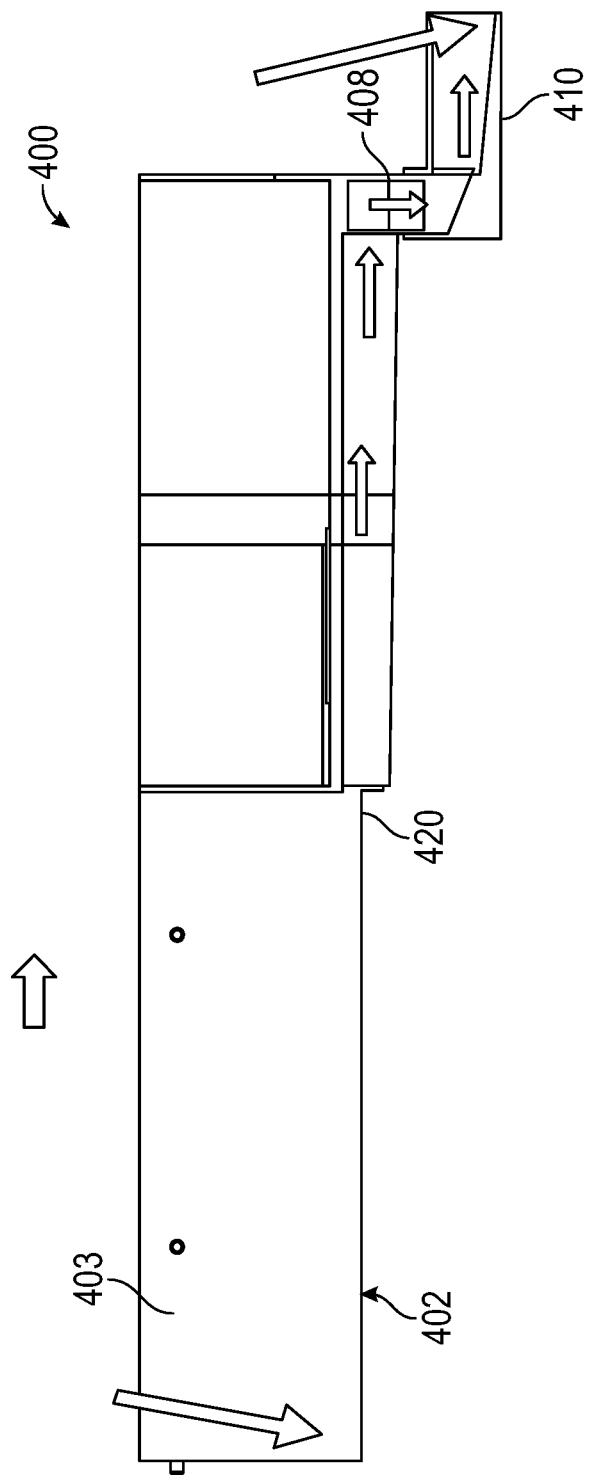
FIG. 5C is a side, cross-sectional view of the leak container.

As illustrated in FIGS. 5A-5C, any leaked fluid received in the leak container 400 can flow out of one or more outlets 408. In at least one example, exit tube attachments 410 can be coupled to the outlets 408 to direct the flow of the fluid. As shown in FIGS. 5B and 5C, the floor 420 of the leak container 400 can be configured to have slopes 422 operable to direct the flow of the fluid towards the outlets 408.

The embodiments shown and described above are only examples. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure to the full extent indicated by the broad general meaning of the terms used in the attached claims. It will therefore be appreciated that the embodiments described above may be modified within the scope of the appended claims.

What is claimed is:

1. A manifold system comprising:
   a supply manifold operable to deliver fluid to a plurality of cold plates to cool a plurality of processing units of a computing system, the supply manifold including a top surface, a bottom surface opposite the top surface, and a side surface connecting the top surface and the bottom surface; and
   a return manifold operable to receive the fluid from the plurality of cold plates, the return manifold including a top surface, a bottom surface opposite the top surface, and a side surface connecting the top surface and the bottom surface,
   wherein the supply manifold has plurality of supply fluid ports equidistantly spaced about the side surface of the supply manifold, and
   wherein the return manifold has plurality of return fluid ports equidistantly spaced about the side surface of the return manifold.

2. The manifold system of claim 1, wherein the plurality of supply fluid ports includes an intake port and a plurality of supply processing ports, wherein the intake port is operable to be fluidly coupled with a supply intake conduit operable to deliver fluid to the supply manifold, and wherein the supply processing ports are operable to be fluidly coupled with corresponding supply processing conduits operable to deliver the fluid to the plurality of cold plates.

3. The manifold system of claim 2, wherein the plurality of supply fluid ports are operable to automatically close upon disconnection of the supply intake conduit and/or the supply processing conduits.

4. The manifold system of claim 1, wherein the plurality of return fluid ports includes a drain port and a plurality of return processing ports, wherein the drain port is operable to be fluidly coupled with a drain conduit operable to remove the fluid from the computing system, and wherein the return processing ports are operable to be fluidly coupled with corresponding return processing conduits operable to remove the fluid from the plurality of cold plates.

5. The manifold system of claim 4, wherein the plurality of return fluid ports are operable to automatically close upon disconnection of the drain conduit and/or the return processing conduits.

6. The manifold system of claim 1, wherein the return manifold includes a top heat sink extending from and/or coupled to the top surface of the return manifold, wherein the top heat sink is operable to reduce a temperature of the fluid.

7. The manifold system of claim 1, wherein the return manifold includes a bottom heat sink extending from and/or coupled to the bottom surface of the return manifold, wherein the bottom heat sink is operable to reduce a temperature of the fluid.

8. The manifold system of claim 1, wherein the return manifold is positioned above the supply manifold such that the bottom surface of the return manifold is adjacent the top surface of the supply manifold.

9. A cooling system comprising:
   a manifold system including:
      a supply manifold operable to deliver fluid to a plurality of cold plates to cool a plurality of processing units of a computing system, the supply manifold including a top surface, a bottom surface opposite the top surface, and a side surface connecting the top surface and the bottom surface; and a return manifold operable to receive the fluid from the plurality of cold plates, the return manifold including a top surface, a bottom surface opposite the top surface, and a side surface connecting the top surface and the bottom surface, wherein the supply manifold has plurality of supply fluid ports equidistantly spaced about the side surface of the supply manifold, and wherein the return manifold has plurality of return fluid ports equidistantly spaced about the side surface of the return manifold;

a plurality of supply processing conduits and a supply intake conduit operable to be fluidly coupled with the plurality of supply fluid ports; and a plurality of return processing conduits and a drain conduit operable to be fluidly coupled with the plurality of return fluid ports, wherein the plurality of supply processing conduits have a same length, and wherein the plurality of return processing conduits have a same length.

10. The cooling system of claim 9, wherein the plurality of supply fluid ports includes an intake port and a plurality of supply processing ports, wherein the intake port is operable to be fluidly coupled with the supply intake conduit operable to deliver fluid to the supply manifold, and wherein the supply processing ports are operable to be fluidly coupled with the corresponding supply processing conduits operable to deliver the fluid to the plurality of cold plates.

11. The cooling system of claim 9, wherein the plurality of supply fluid ports are operable to automatically close upon disconnection of the supply intake conduit and/or the supply processing conduits.

12. The cooling system of claim 9, wherein the plurality of return fluid ports includes a drain port and a plurality of return processing ports, wherein the drain port is operable to be fluidly coupled with the drain conduit operable to remove the fluid from the computing system, and wherein the return processing ports are operable to be fluidly coupled with the corresponding return processing conduits operable to remove the fluid from the plurality of cold plates.

13. The cooling system of claim 9, wherein the plurality of return fluid ports are operable to automatically close upon disconnection of the drain conduit and/or the return processing conduits.

14. The cooling system of claim 9, wherein the return manifold includes a top heat sink extending from and/or coupled to the top surface of the return manifold, wherein the top heat sink is operable to reduce a temperature of the fluid.

15. The cooling system of claim 9, wherein the return manifold includes a bottom heat sink extending from and/or coupled to the bottom surface of the return manifold, wherein the bottom heat sink is operable to reduce a temperature of the fluid.

16. The cooling system of claim 9, wherein the return manifold is positioned above the supply manifold such that the bottom surface of the return manifold is adjacent the top surface of the supply manifold.

17. A computing system comprising:

a plurality of processing units;

a plurality of cold plates operable to cool the corresponding plurality of processing units;

a manifold system including:

a supply manifold operable to deliver fluid to the plurality of cold plates, the supply manifold including a top surface, a bottom surface opposite the top surface, and a side surface connecting the top surface and the bottom surface; and a return manifold operable to receive the fluid from the plurality of cold plates, the return manifold including a top surface, a bottom surface opposite the top surface, and a side surface connecting the top surface and the bottom surface, wherein the supply manifold has plurality of supply fluid ports equidistantly spaced about the side surface of the supply manifold, and wherein the return manifold has plurality of return fluid ports equidistantly spaced about the side surface of the return manifold;

a plurality of supply processing conduits and a supply intake conduit operable to be fluidly coupled with the plurality of supply fluid ports, wherein the plurality of supply processing conduits are operable to be fluidly coupled with the corresponding cold plates to deliver the fluid to the cold plates; and a plurality of return processing conduits and a drain conduit operable to be fluidly coupled with the plurality of return fluid ports, wherein the plurality of return processing conduits are operable to be fluidly coupled with the corresponding cold plates to return the fluid from the cold plates to the return manifold, wherein the plurality of supply processing conduits have a same length, and wherein the plurality of return processing conduits have a same length.

18. The computing system of claim 17, wherein the plurality of supply fluid ports are operable to automatically close upon disconnection of the supply intake conduit and/or the supply processing conduits, and wherein the plurality of return fluid ports are operable to automatically close upon disconnection of the drain conduit and/or the return processing conduits.

19. The computing system of claim 17, wherein the return manifold includes a top heat sink extending from and/or coupled to the top surface of the return manifold, wherein the top heat sink is operable to reduce a temperature of the fluid.

20. The computing system of claim 17, further comprising a leak container, wherein the manifold system is operable to be disposed in the leak container, wherein the leak container is operable to prevent fluid that leaks from the manifold system to reach the plurality of processing units.

* * * * *